United States Patent
Noro

(10) Patent No.: US 10,552,255 B2
(45) Date of Patent: Feb. 4, 2020

(54) MEMORY DEVICE

(71) Applicant: TOSHIBA MEMORY CORPORATION, Minato-ku, Tokyo (JP)

(72) Inventor: Hiromi Noro, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 49 days.

(21) Appl. No.: 15/917,495

(22) Filed: Mar. 9, 2018

(65) Prior Publication Data
US 2018/0196711 A1 Jul. 12, 2018

Related U.S. Application Data

(63) Continuation of application No. PCT/JP2016/058214, filed on Mar. 9, 2016.

(60) Provisional application No. 62/217,659, filed on Sep. 11, 2015.

(51) Int. Cl.
*G06F 11/10* (2006.01)
*G11C 29/52* (2006.01)
*G06F 3/06* (2006.01)

(52) U.S. Cl.
CPC ...... *G06F 11/1012* (2013.01); *G06F 11/1048* (2013.01); *G06F 11/1068* (2013.01); *G11C 29/52* (2013.01); *G06F 3/0619* (2013.01)

(58) Field of Classification Search
CPC .... G06F 3/0619; G06F 11/1012; G06F 11/10; G06F 11/1068; G06F 11/1048; G11C 29/52
See application file for complete search history.

(56) References Cited

U.S. PATENT DOCUMENTS

| | | | |
|---|---|---|---|
| 9,350,386 B2* | 5/2016 | Park | H03M 13/09 |
| 2004/0008562 A1 | 1/2004 | Ito et al. | |
| 2004/0184327 A1 | 9/2004 | Okuda | |
| 2004/0187065 A1 | 9/2004 | Hwang et al. | |
| 2005/0240838 A1 | 10/2005 | Iwai | |
| 2005/0286330 A1 | 12/2005 | Ito et al. | |
| 2007/0133329 A1* | 6/2007 | Braun | G11C 7/04 |
| | | | 365/212 |
| 2007/0271495 A1 | 11/2007 | Shaeffer et al. | |

(Continued)

FOREIGN PATENT DOCUMENTS

| | | |
|---|---|---|
| JP | 04149899 A | 5/1992 |
| JP | 07129424 A | 5/1995 |

(Continued)

OTHER PUBLICATIONS

International Search Report (ISR) and Written Opinion dated May 24, 2016 issued in International Application No. PCT/JP2016/058214.

*Primary Examiner* — Guy J Lamarre
(74) *Attorney, Agent, or Firm* — Holtz, Holtz & Volek PC

(57) ABSTRACT

According to one embodiment, a semiconductor memory device includes: a memory configured to store data; an error correcting circuit configured to correct an error in data read from the memory, and to generate a first signal of a first state, which is transmitted to an external along with the data if the error in the data cannot be corrected; and a first pin configured to transmit the first signal to the external and receive a data mask signal from the external.

20 Claims, 5 Drawing Sheets

(56) References Cited

U.S. PATENT DOCUMENTS

| | | | | |
|---|---|---|---|---|
| 2013/0060987 A1* | 3/2013 | Bolen | ............... | G06F 13/00 |
| | | | | 710/316 |
| 2013/0152082 A1* | 6/2013 | Ahrens | ............ | G06F 11/0781 |
| | | | | 718/1 |
| 2014/0331006 A1 | 11/2014 | Chung et al. | | |

FOREIGN PATENT DOCUMENTS

| | | | |
|---|---|---|---|
| JP | 2004046969 A | 2/2004 |
| JP | 2004234770 A | 8/2004 |
| JP | 2004259426 A | 9/2004 |
| JP | 2005310313 A | 11/2005 |
| JP | 2006004559 A | 1/2006 |
| WO | 2007136655 A2 | 11/2007 |

\* cited by examiner

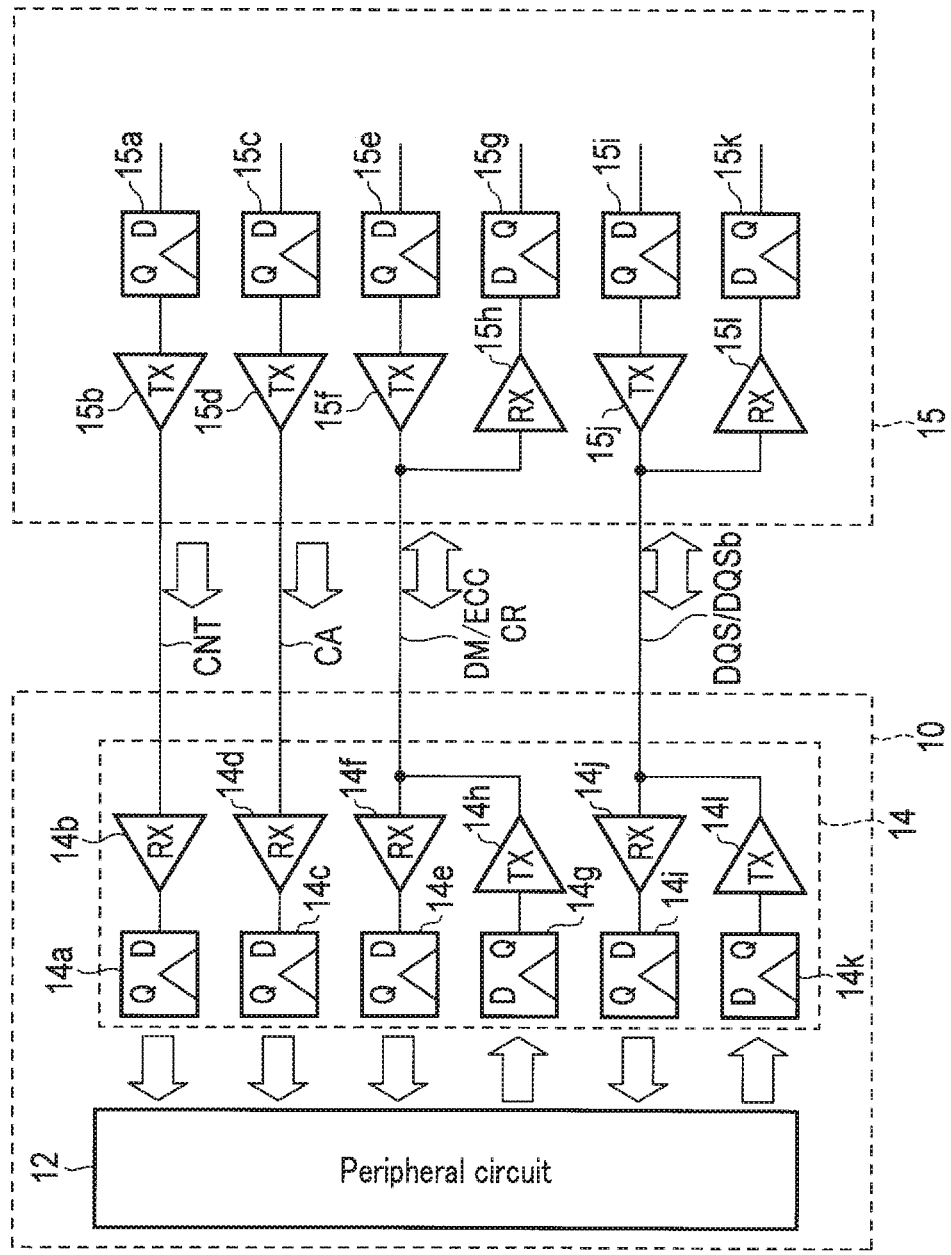
F I G. 4

MEMORY DEVICE

CROSS-REFERENCE TO RELATED APPLICATIONS

This application is a Continuation Application of PCT Application No. PCT/JP2016/058214, filed Mar. 9, 2016, and based upon and claiming the benefit of U.S. Provisional Application No. 62/217,659, filed Sep. 11, 2015, the entire contents of which are incorporated herein by reference.

FIELD

Embodiments described herein relate generally to a memory device.

BACKGROUND

An MRAM is a memory device that adopts a magnetic element having a magnetoresistive effect as a memory cell for storing information, and is featured by fast operation, large storage capacity and non-volatility. Research and development have been in progress to replace a volatile memory, such as a DRAM and an SRAM, with an MRAM. In order to lower the development cost and enable smooth replacement, the MRAM should desirably operate on the same specifications as the DRAM and SRAM.

BRIEF DESCRIPTION OF THE DRAWINGS

FIG. 4 is a circuit diagram illustrating how the semiconductor memory device and the host are connected according to the embodiment.

DETAILED DESCRIPTION

Figure 1:
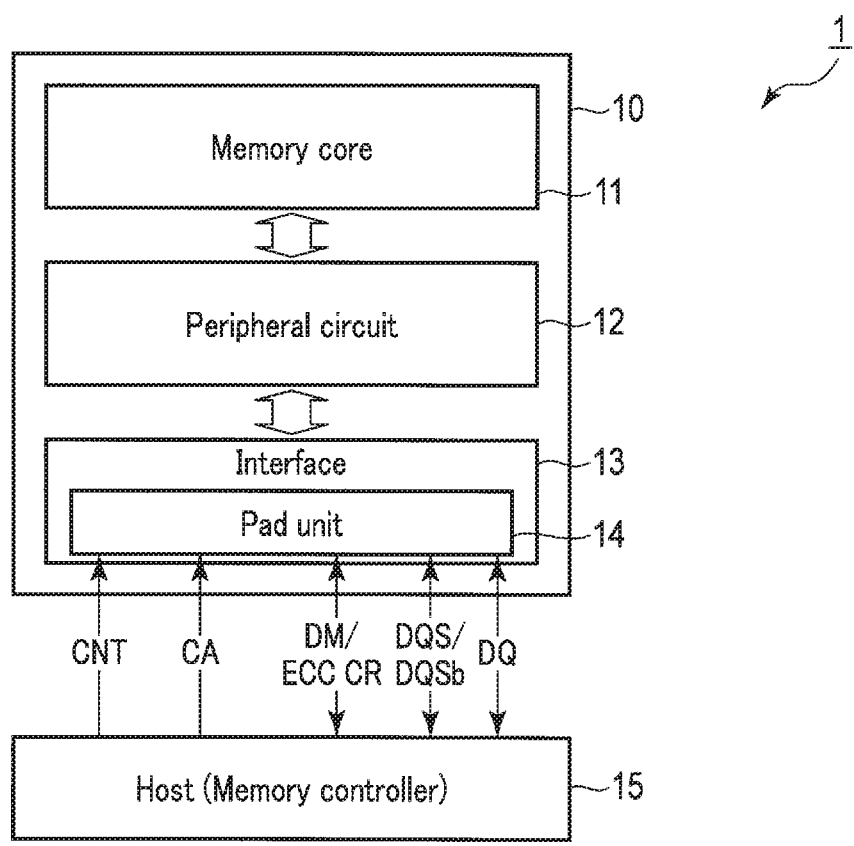
FIG. 1 is a block diagram schematically illustrating a semiconductor memory device and a host according to an embodiment.

In general, according to one embodiment, a memory device includes: a memory configured to store data; an error correcting circuit configured to correct an error in data read from the memory, and to generate a first signal of a first state, which is transmitted to an external along with the data if the error in the data cannot be corrected; and a first pin configured to transmit the first signal to the external and receive a data mask signal from the external.

An embodiment will now be described with reference to the accompanying drawings. In the descriptions below and the drawings, the same reference numerals are used to denote similar or corresponding elements.

[1] Embodiment

[1-1] Memory System 1

First, a description will be given of memory system 1 according to the embodiment. As shown in FIG. 1, the memory system 1 comprises a semiconductor memory device 10 and a host (or a memory controller) 15. The semiconductor memory device 10 of the embodiment is, for example, a spin transfer torque type magnetoresistive random access memory (STT-MRAM).

As shown in FIG. 1, the semiconductor memory device 10 includes a memory core 11, a peripheral circuit 12 and an interface 13.

The memory core 11 is provided with a plurality of memory cells for storing data. The peripheral circuit 12 writes data to the memory core 11 and reads data therefrom.

The interface 13 is provided with a pad unit 14 where commands, addresses and data are received. The pad unit 14 includes a plurality of pads. The interface 13 is connected to the host 15 through the pad unit 14 and control signal line CNT. The interface 13 is connected to the host 15 through the pad unit 14 and data strobe signal line DQS/DQSb. The interface 13 is connected to the host 15 through the pad unit 14 and data mask signal line DM/ECC CR<k:0>. The interface 13 is connected to the host 15 through the pad unit 14 and command/address line CA<n:0>. The interface 13 is connected to the host 15 through the pad unit 14 and data line DQ<m:0>. Letters k, n and m denote natural numbers.

Control signal line CNT is used for transmitting and receiving control signals. The control signal include clock signal CK/CKb, clock enable signal CKE and chip select signal CS. Command/address line CA<n:0> is used for transmitting and receiving commands and addresses. Data mask signal line DM/ECC CR<k:0> is used for transmitting and receiving data mask signals and error detection signals. Data line DQ<m:0> is used for transmitting and receiving data between the semiconductor memory device 10 and the host 15. Data strobe signal line DQS/DQSb is used for transmitting and receiving data signals DQ. Clock signals CK/CKb and data strobe signals DQS/DQSb are used for controlling the operation timing of the semiconductor memory device 10.

Each of control signal line CNT, data strobe signal line DQS/DQSb, data mask signal line DM/ECC CR<k:0>, command/address line CA<n:0> and data line DQ<m:0> may include a pin, or may be the pin itself.

[1-2] Semiconductor Memory Device 10

Figure 2:
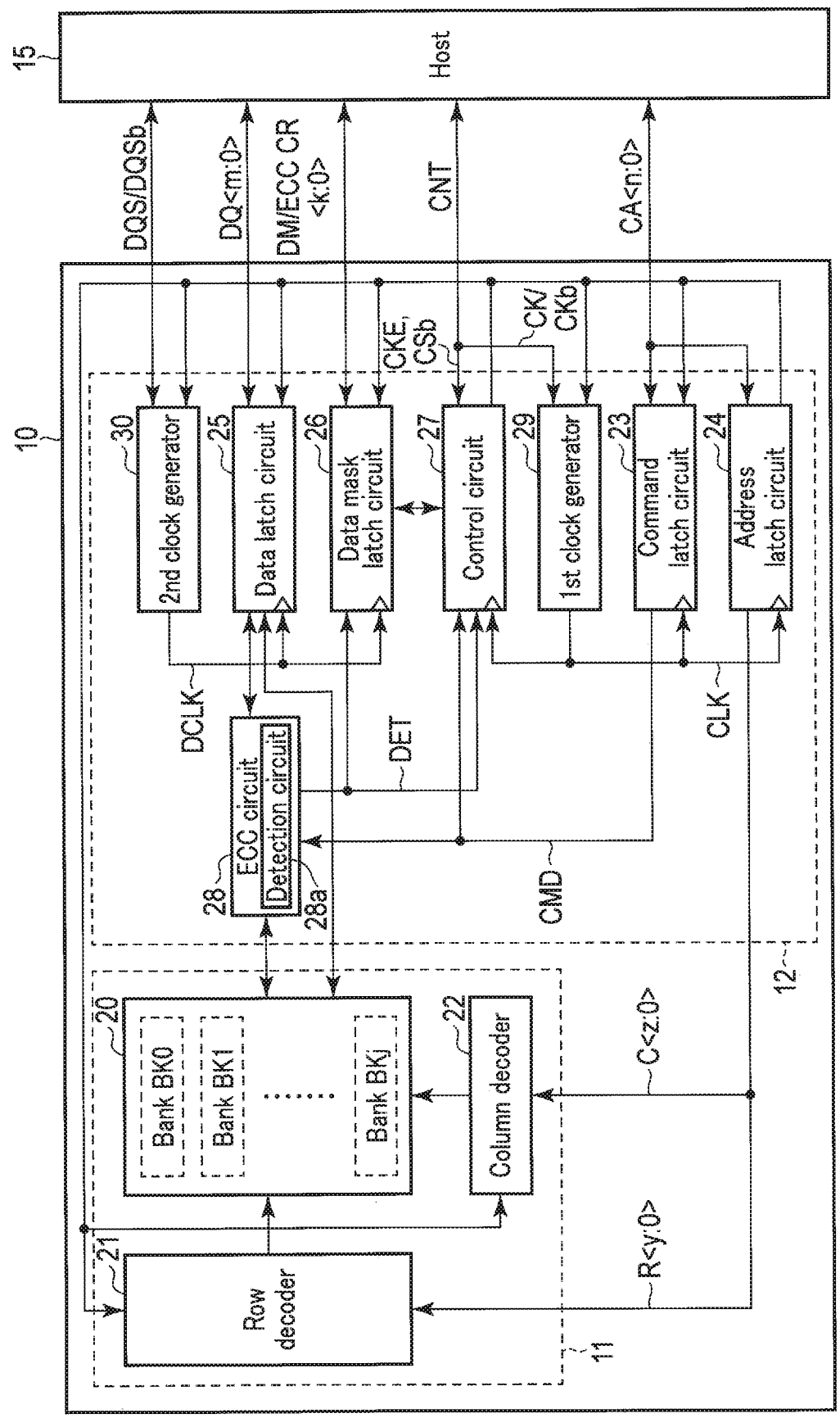
FIG. 2 is a block diagram schematically illustrating the semiconductor memory device of the embodiment.

The semiconductor device 10 will be described, referring to FIG. 2.

[1-2-1] Memory Core 11

The memory core 11 of the semiconductor memory device 10 will be described. The memory core 11 is provided with a memory area 20, a row decoder 21 and a column decoder 22. The memory area 20 includes (j+1) banks BK0 to BKj (j: a natural number). Each of these banks BK0 to BKj can be activated individually. Unless the banks BK0 to BKj have to be discriminated from each other, they will be referred to simply as banks BK.

The row decoder 21 decodes a bank address BA<x:0>, with which one of the banks BK0 to BKj is selected, and a row address <y:0>, with which a row of the selected bank is selected.

The column decoder 22 decodes a column address C<z:0>, with which a column in the memory area 20 is selected.

[1-2-2] Peripheral Circuit 12

The peripheral circuit 12 of the semiconductor memory device 10 will be described. As shown in FIG. 2, the peripheral circuit 12 is provided with a command latch circuit 23, an address latch circuit 24, a data latch circuit 25, a data mask latch circuit 26, a control circuit 27, an error correcting code (ECC) circuit 28, a first clock generator 29 and a second clock generator 30.

The command latch circuit 23 receives commands CMD from the host 15 via the command/address line CA<n:0> and temporarily stores the received commands CMD. The commands CMD are supplied to the control circuit 27 and the ECC circuit 28.

The address latch circuit 24 receives addresses ADD. Of the addresses ADD, row addresses R<y:0> are supplied from the address latch circuit 24 to the row decoder 21, and column addresses C<z:0> are supplied from the address latch circuit 24 to the column decoder 22.

The data latch circuit 25 temporarily stores input data supplied thereto from the host 15 via the data line DQ<m:0>, and temporarily stores output data read from a selected bank. The input data is written in the memory cells of a selected bank.

The data mask latch circuit 26 temporarily stores data mask signals supplied thereto from the host 15 via the data mask line DM/ECC CR<k:0> or output data representing error correction results of the ECC. The data mask signals are signals for controlling a write mask when the input data is written in the memory cells.

The control circuit 27 controls the operation of the semiconductor memory device 10, based on the clock enable signal CKE, chip select signal CSb and command CMD supplied from the host 15. Upon receipt of a data mask signal, the control circuit 27 performs data masking. The data masking is an operation for preventing a target memory cell from being written. The entered clock enable signal CKE and chip select signal CSb are stored in the control circuit 27 based on an internal clock CLK generated by the first clock generator 29. Based on the clock enable signal CKE and chip select signal CSb stored in the control circuit 27, the subsequent operation of the first clock generator 29 may be controlled to stop the generation of the internal clock CLK.

When data is written, the ECC circuit 28 generates a parity bit (an error correcting code) for data stored in the data latch circuit 25 and being to be written, and adds the parity bit to the data. The resultant data, including the parity bit added thereto, is written in the memory cell array.

When data is read, the ECC circuit 28 performs error correction processing for the data read from the memory cell array and supplied to the data latch circuit 25. By performing the error correction processing using a parity bit, the ECC circuit 28 checks whether the data read from the memory array contains an error. If an error is detected in the data, the ECC circuit corrects the detected error. The control circuit 27 writes the error-corrected data back into the memory cell array. In the present embodiment, the operation of writing the error-corrected data (i.e., the data whose error is corrected by the ECC processing) back into the memory cell array will be referred to as a write back operation. For example, if no data is detected in the data read from the memory cell array, the semiconductor memory device 10 of the present embodiment does not execute the write back operation. The write back operation ensures reliability for the data stored in the semiconductor memory device 10. The ECC circuit 28 may be provided in the memory area 20 (bank BK).

The ECC circuit 28 is provided with a detection circuit 28a. If it is determined that the number of bits of an error is larger than the number of bits correctable by the ECC circuit 28, the detection circuit 28a supplies an error detection signal DET of H (high) level to the data mask latch circuit 26 and control circuit 27. By the data mask latch circuit 26 and the control circuit 27, the error detection signal DET is supplied to the host 15 via data mask signal line DM/ECC CR<k:0> used for transmitting and receiving data mask signals.

A more specific description will be given. Let us assume that the error correction capability of the ECC circuit 28 is "n" bits (n: a natural number) for each error correction unit. In this case, if an error is "n+1" bits and more for each correction unit, the detection circuit 28a sets the error detection signal DET to "H" level. Conversely, if an error is "n" bits and less for each error correction unit, the detection circuit 28a sets the error detection signal DET to "L" level.

The host 15 can recognize that the data received during the "H" level of the error detection signal DET is data for which the error correction processing has not been performed properly. Therefore, the host 15 can take proper action to the data for which the error correction processing has not been performed properly. For example, the host 15 can discard the data or refrain from performing the write back operation. With respect to the data received during the "L" level of the error detection signal DET, the host 15 can recognize it as data for which the error correction processing has been performed properly.

Although the ECC circuit 28 and the detection circuit 28a were described as functionally different circuits, they may be integrated as one circuit.

The first clock generator 29 generates internal clock CLK based on the clock signal CK/CKb supplied from the host 15. Internal clock CLK is supplied to the command latch circuit 23, control circuit 27 and address latch circuit 24. Internal clock CLK is used for controlling the operation timings of these circuits.

The second clock generator 30 generates internal clock DCLK based on the data strobe signal DQS/DQSb supplied from the host 15. Internal clock DCLK is supplied to the data latch circuit 25 and data mask latch circuit 26. Internal clock DCLK is used for controlling the operation timings of these circuits.

[1-2-3] Bank BK

Figure 3:
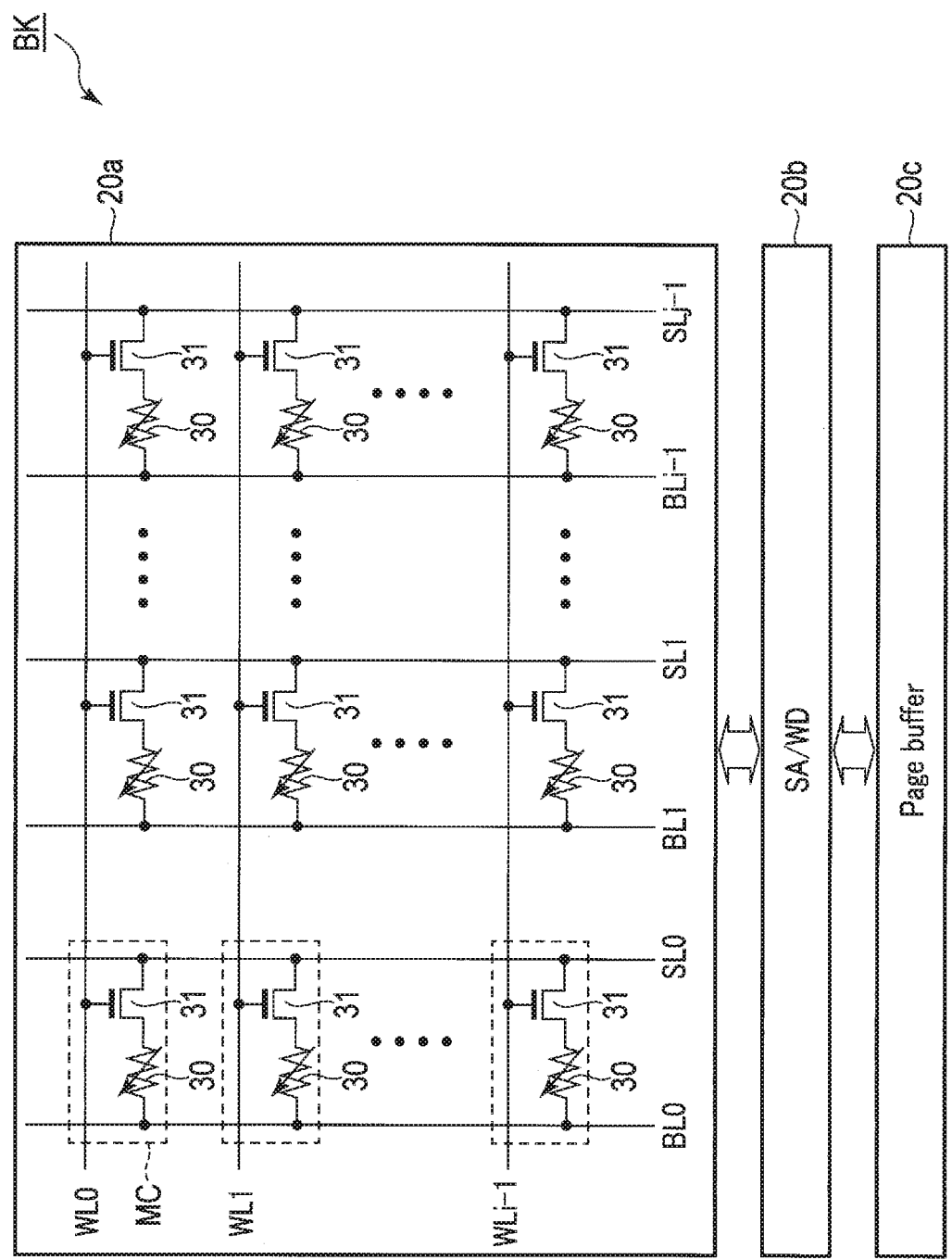
FIG. 3 is a block diagram schematically illustrating banks of the semiconductor memory device of the embodiment.

A description will be given of a bank BK of the memory area 20 with reference to FIG. 3. The bank BK comprises a sense amplifier/write driver (SA/WD) 20b, a page buffer 20c and a memory cell array 20a.

The sense amplifier/write driver 20b is arranged in the bit line direction of the memory cell array 20a. The sense amplifier/write driver 20b includes a sense amplifier and a write driver. The sense amplifier is connected to the bit lines BL, and reads data from a memory cell MC by detecting a current flowing through the memory cell MC connected to a selected word line WL. The write driver is connected to the bit lines BL, and writes data in a memory cell MC by causing a current to flow through the memory cell MC connected to the selected word line. The sense amplifier/write driver 20b controls the bit lines BL and source lines SL based on control signals supplied from the control circuit 27. Data is transferred between the sense amplifier/write driver 20b and the data lines DQ via the data latch circuit 25.

The page buffer 20c temporarily stores data read from the memory cell array 20c or data received from the host 15. Data is written in the memory cell array 20a in units of a plurality of memory cell transistors (in units of pages). The unit of data that can be written in the memory cell array 20a at a time is called "page." In the present embodiment, the page buffer 20c is provided for each bank BK, and has a storage capacity that enables all-page data of the bank BK to be temporarily stored.

When data is written in the memory cell array 20a, the host 15 supplies a page address (indicating an area in which data is to be written) and write data to the semiconductor memory device 10, together with a write command. The control circuit 27 stores the write data received from the host in the page buffer 20c, and writes the write data stored in the page buffer 20c in the memory cell MC designated by the page address.

When data is read from the memory cell array 20a, the host 15 supplies a page address (indicating an area from which the data is to be read) to the semiconductor memory device 10, together with a read command. The control circuit 27 reads data from the memory cell designated by the page address and supplies the read data to the page buffer 20c.

The memory cell array 20a comprises a plurality of memory cells MC arranged in a matrix pattern. A plurality of word lines WL0 to WLi−1, and a plurality of bit lines BL0 to BLj−1 and a plurality of source lines SL0 to SLj−1 are arranged in the memory cell array 20a. One row of the memory cell array 20a is connected to each of the word lines WL1, and one column of the memory cell array 20a is connected to each pair constituted by one bit line BL and one source line SL.

Each memory cell MC includes a magnetic tunnel junction (MTJ) element 30 and a selection transistor 31. The selection transistor 31 is, for example, an N-channel MOS-FET.

One end of the MTJ element 30 is connected to bit line BL, and the other end is connected to the drain (source) of the selection transistor 31. The gate of the selection transistor 31 is connected to word line WL, and the source (drain) is connected to source line SL.

The above-described configuration of bank BK is merely an example, and the bank BK may have any other configuration.

[1-2-4] Connection Between Semiconductor Memory Device 10 and Host 15

A description will be given, with reference to FIG. 4, as to how the semiconductor memory device 10 and the host 15 are connected to each other.

As shown in FIG. 4, the pad unit 14 comprises D flip-flops 14a, 14c, 14e, 14g, 14i and 14k, receiving circuits 14b, 14d, 14f and 14j, and transmitting circuits 14h and 14l.

As shown in FIG. 4, the host 15 comprises D flip-flops 15a, 15c, 15e, 15g, 15i and 15k, transmitting circuits 15b, 15d, 15f and 15j, and receiving circuits 15h and 15l.

Where D flip-flops 14a, 14c, 14e, 14g, 14i, 14k, 15a, 15c, 15e, 15g, 15i and 15k do not have to be discriminated from each other, they will be referred to simply as "D flip-flops." Where transmitting circuits 14h, 14l, 15b, 15d, 15f and 15j do not have to be discriminated from each other, they will be referred to simply as "transmitter." Where receiving circuits 14b, 14d, 14f, 14j, 15h and 15l do not have to be discriminated from each other, they will be referred to simply as "Receiver."

The transmitting circuits transmit signals supplied to their input terminals. The receiving circuits receive signals supplied to their input terminals.

Each D flip-flop holds data supplied to terminal D in synchronism with the rise of clock CLK. To be more specific, when clock CLK rises, each D flip-flop output, from terminal Q, data supplied to terminal D at the moment. Each D flip-flops repeatedly outputs the same data until clock CLK is input next.

As shown in FIG. 4, error detection signal DET is supplied to data mask signal line DM/ECC CR by way of D flip-flop 14g and transmitting circuit 14h. The host 15 receives the error detection signal DET from the data mask signal line DM/ECC CR by way of receiving circuit 15h and D flip flop 15g.

This error detection signal DET is output, for example, when data is read. On the other hand, data mask signal DM is input when data is written. Therefore, the error detection signal DET and the data mask signal DM do not collide with each other. For this reason, two kinds of signal can be transmitted and received by use of only one signal line.

[1-3] Read Operation

[1-3-1] Example 1 of Error Correction Unit According to Present Embodiment

Figure 5:
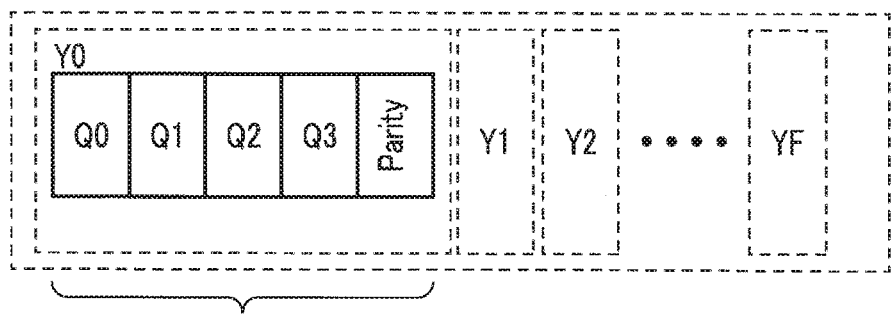
FIG. 5 illustrates an error correct unit of the semiconductor memory device of the embodiment.

The error correction unit of the ECC circuit 28 will be described with reference to FIG. 5.

The control circuit 27 of the present embodiment performs error correction in units of data Q0-Q3 corresponding to predetermined column addresses YX (X: an integer number). Data Q0-Q3 is a pre-fetch unit at the time of a read operation. To be more specific, the control circuit 27 reads the data Q0-Q3 and parities related to column address Y0 from the memory area 20. Based on the data Q0-Q3 and parities related to column address Y0, the ECC circuit 28 performs error correction for data Q0-Q3 related to column address Y0. Likewise, the ECC circuit 28 performs error correction for data Q0-Q3 related to other column addresses YX.

[1-3-2] Example 1 of Read Operation According to Present Embodiment

Figure 6:
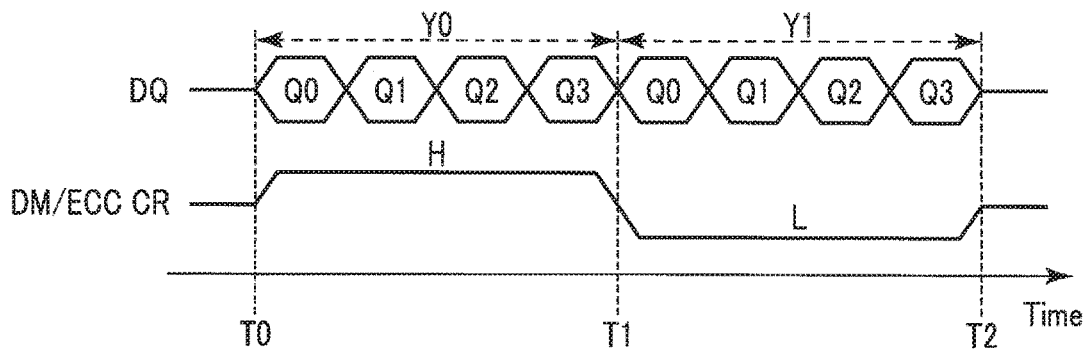
FIG. 6 is a waveform chart illustrating a read operation performed by the semiconductor memory device of the embodiment.

An example of a read operation will be described with reference to FIG. 6.

The outline of example 1 of a read operation performed according to the present embodiment will be described first. According to the present embodiment, the ECC circuit 28 performs error correction, using example 1 of the error correction unit.

The ECC circuit 28 performs error correction for data Q0-Q3 related to column address Y0. If data Q0-Q3 related to column address Y0 contains an error that cannot be corrected by the ECC circuit 28, the detection circuit 28a notifies the host 15 to this effect. To be specific, at time T0 (when the semiconductor memory device 10 supplies data Q0-Q3 related to column address Y0 to the host 15), the detection circuit 28a sets the error detection signal DET output from the data mask signal line DM/ECC CR to "H" level.

In addition, the ECC circuit 28 performs error correction for data Q0-Q3 related to Y1. If data Q0-Q3 related to Y1 contains no error, or if the ECC circuit 28 successfully performs the error correction for data Q0-Q3, the detection circuit 28a notifies the host 15 to this effect. To be specific, at time T1 (when the semiconductor memory device 10 supplies data Q0-Q3 related to column address Y1 to the host 15), the detection circuit 28a sets the error detection signal DET output from the data mask signal line DM/ECC CR to "L" level.

The output timings of data and error detection signal DET may be controlled by the control circuit 27.

[1-3-3] Example 2 of Error Correction Unit According to Present Embodiment

Figure 7:
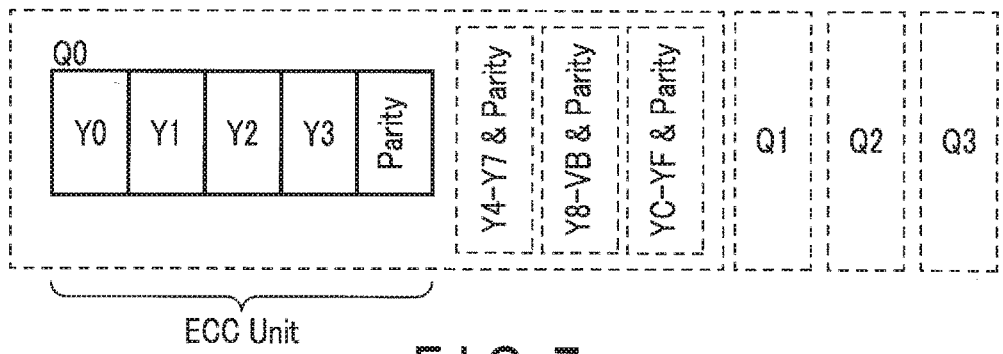
FIG. 7 is an error correction unit of the semiconductor device of the embodiment.
Figure 8:
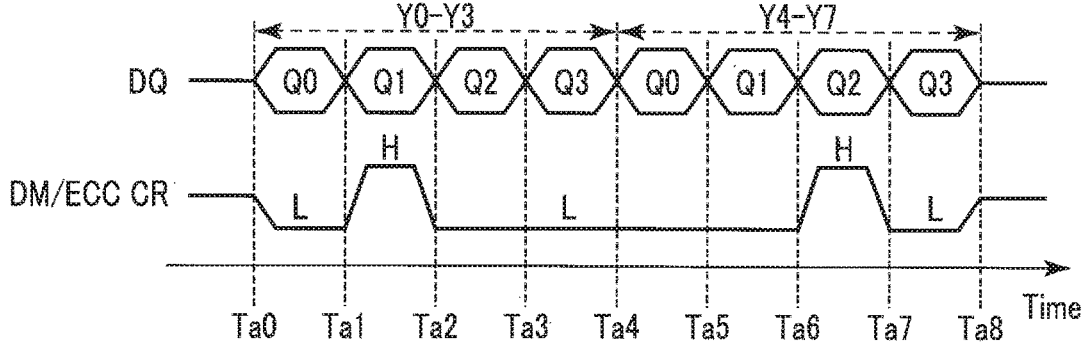
FIG. 8 is a waveform chart illustrating a read operation performed by the semiconductor device of the embodiment.

The error correction unit of the ECC circuit 28 will be described with reference to FIG. 7.

The control circuit 27 of the present embodiment performs error correction for the data included in predetermined data QZ (Z: an integer number) and corresponding to a plurality of column addresses. To be specific, the control circuit 27 reads data included in data Q0 and corresponding to column addresses Y0-Y3 from the memory area 20, along with parities. The ECC circuit 28 performs error correction for the data included in data Q0 and corresponding to column addresses Y0-Y3, based on the read data (included in data Q0 and corresponding to column addresses Y0-Y3) and parities. Likewise, the ECC circuit 28 performs error correction for the data included in data Q0 and corresponding to other column addresses. The ECC circuit 28 performs error correction likewise for data Q1-Q3.

[1-3-4] Example 2 of Read Operation According to Present Embodiment

The outline of example 2 of a read operation performed according to the present embodiment will be described. According to the present embodiment, the ECC circuit 28 performs error correction, using example 2 of the error correction unit.

The ECC circuit 28 performs error correction for data Q0 and the data related to column addresses Y0-Y3. If data Q0 and the data related to column addresses Y0-Y3 contain no error or if the ECC circuit 28 successfully performs the error correction for data Q0 and the data related to column addresses Y0-Y3, the detection circuit 28*a* notifies the host 15 to this effect. To be specific, at time Ta0 (when the semiconductor memory device 10 supplies data Q0 and the data related to column address Y0-Y3 to the host 15), the detection circuit 28*a* sets the error detection signal DET output from the data mask signal line DM/ECC CR to "L" level.

The ECC circuit 28 performs error correction for data Q1 and the data related to column addresses Y0-Y3. If data Q1 and the data related to column addresses Y0-Y3 contain an error that cannot be corrected by the ECC circuit 28, the detection circuit 28*a* notifies the host 15 to this effect. To be specific, at time Ta1 (when the semiconductor memory device 10 supplies data Q1 and the data related to column addresses Y0-Y3 to the host 15), the detection circuit 28*a* sets the error detection signal DET output from the data mask signal line DM/ECC CR to "H" level.

The ECC circuit 28 performs error correction for data Q2 and the data related to column addresses Y0-Y3. If data Q2 and the data related to column addresses Y0-Y3 contain no error or if the ECC circuit 28 successfully performs the error correction for data Q2 and the data related to column addresses Y0-Y3, the detection circuit 28*a* notifies the host 15 to this effect. To be specific, at time Ta2 (when the semiconductor memory device 10 supplies data Q2 and the data related to column addresses Y0-Y3 to the host 15), the detection circuit 28*a* sets the error detection signal DET to "L" level.

The ECC circuit 28 performs error correction for data Q3 and the data related to column addresses Y0-Y3. If data Q3 and the data related to column addresses Y0-Y3 contain no error or if the ECC circuit 28 successfully performs the error correction for data Q3 and the data related to column addresses Y0-Y3, the detection circuit 28*a* notifies the host 15 to this effect. To be specific, at time Ta3 (when the semiconductor memory device 10 supplies data Q3 and the data related to column addresses Y0-Y3 to the host 15), the detection circuit 28*a* sets the error detection signal DET to "L" level.

The ECC circuit 28 performs error correction for data Q0 and the data related to column addresses Y4-Y7. If data Q0 and the data related to column addresses Y4-Y7 contain no error or if the ECC circuit 28 successfully performs the error correction for data Q0 and the data related to column addresses Y4-Y7, the detection circuit 28*a* notifies the host 15 to this effect. To be specific, at time Ta4 (when the semiconductor memory device 10 supplies data Q00 and the data related to column address Y4-Y7 to the host 15), the detection circuit 28*a* sets the error detection signal DET to "L" level.

The ECC circuit 28 performs error correction for data Q1 and the data related to column addresses Y4-Y7. If data Q1 and the data related to column addresses Y4-Y7 contain no error or if the ECC circuit 28 successfully performs the error correction for data Q1 and the data related to column addresses Y4-Y7, the detection circuit 28*a* notifies the host 15 to this effect. To be specific, at time Ta5 (when the semiconductor memory device 10 supplies data Q1 and the data related to column address Y4-Y7 to the host 15), the detection circuit 28*a* sets the error detection signal DET to "L" level.

The ECC circuit 28 performs error correction for data Q2 and the data related to column addresses Y4-Y7. If data Q2 and the data related to column addresses Y4-Y7 contain an error that cannot be corrected by the ECC circuit 28, the detection circuit 28*a* notifies the host 15 to this effect. To be specific, at time Ta6 (when the semiconductor memory device 10 supplies data Q2 and the data related to column addresses Y4-Y7 to the host 15), the detection circuit 28*a* sets the error detection signal DET to "H" level.

The ECC circuit 28 performs error correction for data Q3 and the data related to column addresses Y4-Y7. If data Q3 and the data related to column addresses Y4-Y7 contain no error or if the ECC circuit 28 successfully performs the error correction for data Q3 and the data related to column addresses Y4-Y7, the detection circuit 28*a* notifies the host 15 to this effect. To be specific, at time Ta7 (when the semiconductor memory device 10 supplies data Q3 and the data related to column address Y4-Y7 to the host 15), the detection circuit 28*a* sets the error detection signal DET to "L" level.

As described above, the semiconductor memory device of the present embodiment controls the error detection signal DET for each pre-fetch.

[1-4] Advantages of Present Embodiment

According to the embodiment described above, the semiconductor memory device 10 checks, in a read operation, whether there is an error that cannot be corrected by the ECC circuit 28. If such an error is detected, the semiconductor memory device 10 notifies the host 15 of the presence of the error through the data mask signal line DM/ECC CR, when the data that cannot be corrected is being transmitted.

In recent years, techniques are being developed for providing an ECC circuit originally prepared for a host in a semiconductor memory device. Where the ECC circuit is installed on a memory chip, accurate data can be output as long as an error in the data is within the error correction capability of the ECC circuit. However, if the error is beyond the error correction capability of the ECC circuit, read data containing an error or read data for which improper correction has been made may be output and supplied to the host.

If there is no specification that final correction information obtained by the ECC circuit is supplied to the host, the host cannot determine whether data received from the semiconductor memory device is correct.

According to the present embodiment, when the semiconductor memory device outputs read data, error-correction-impossible information (i.e., error detection signal DET of "H (high)" level) is supplied to the host together with the read data. Owing to this feature, the host can determine the validity of the data received from the semiconductor memory device, and therefore does not perform an improper operation.

In the embodiment described above, the semiconductor memory device sends error-correction-impossible information to the host by way of the data mask signal line. This is because a data mask signal is not transmitted to the semiconductor memory device 10 in a read operation mode. For this reason, no signal line or pin is additionally required for transmitting the error-correction-impossible information to the host. As a result, the semiconductor memory device of the present embodiment can transmit the error-correction-impossible information to the host with no need to increase the circuit area.

[2] Modification

When data is output to the data line, it is only required that error detection signal DET corresponding to that data be output from data mask signal line DM/ECC CR, and the error correction unit need not be the unit described above.

The configuration of a bank described in connection with the above embodiment is merely an example, and various modifications can be made.

The specifications applied to the semiconductor memory device of the embodiment may be JEDEC memory specifications, such as LPDDR and DDR. Furthermore, the semiconductor memory device may employ a memory that is not based on particular specifications.

In connection with the embodiment mentioned above, the semiconductor memory device was described as an MRAM employing a magnetoresistive effect element but is not limited thereto. The semiconductor memory device may be any type of semiconductor memory device, whether it is a volatile memory or a non-volatile memory. In addition, the semiconductor memory device may be realized as a resistance change memory similar in type to the MRAM, for example, a resistive random access memory (ReRAM) or a phase-change random access memory (PCRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the embodiment.

What is claimed is:

1. A memory device comprising:
a memory configured to store data;
an error correcting circuit configured to correct an error in data read from the memory, and to generate a first signal of a first state, which is transmitted to an external circuit along with the data if the error in the data cannot be corrected; and
a first pin configured to transmit the first signal to the external circuit and receive a data mask signal from the external circuit.

2. The memory device according to claim 1, wherein if the error correcting circuit successfully corrects the error in the data, the error correcting circuit generates the first signal of a second state different from the first state, which is transmitted to the external circuit along with the data.

3. The memory device according to claim 2, wherein the error correcting circuit can correct the error in the data and generates the first signal of the second state, if the error is "n" bits (n: a natural number) or less for each error correction unit, and
wherein the error correcting circuit generates the first signal of the first state if the error is "n+1" bits or more for each error correction unit.

4. The memory device according to claim 1, wherein the memory device is configured such that the data and the first signal are output in a read operation mode.

5. The memory device according to claim 1, wherein the first pin is configured to receive the data mask signal in a write operation mode.

6. The memory device according to claim 1, wherein upon reception of the data mask signal, the memory device does not perform a write operation for the memory.

7. The memory device according to claim 1, wherein the data corresponding to the first signal of the first state is not written back to the memory.

8. The memory device according to claim 1, wherein the memory comprises a resistance change element capable of holding data.

9. The memory device according to claim 1, wherein the memory is one of a magnetoresistive random access memory (MRAM), a ferroelectric random access memory (FeRAM), a phase change random access memory (PCRAM) and a resistive random access memory (ReRAM).

10. A memory system comprising:
a memory configured to store data;
a controller;
an error correcting circuit configured to correct an error in data read from the memory, and to simultaneously supply both the data and a first signal of a first state to the controller, if the error in the data cannot be corrected; and
a first pin configured to transmit the first signal to the controller and receive a data mask signal from the controller,
wherein the controller does not use the data received simultaneously with the first signal of the first state.

11. The memory system according to claim 10, wherein when the error correcting circuit successfully corrects the error in the data, the memory system simultaneously transmits the first signal of a second state different from the first state and the data to the controller.

12. The memory system according to claim 11, wherein the error correcting circuit can correct the error in the data and generates the first signal of the second state, if the error is "n" bits (n: a natural number) or less for each error correction unit, and
wherein the error correcting circuit generates the first signal of the first state if the error is "n+1" bits or more for each error correction unit.

13. The memory system according to claim 10, wherein the memory system is configured such that the data and the first signal are output in a read operation mode.

14. The memory system according to claim 10, wherein the first pin is configured to receive the data mask signal in a write operation mode.

15. The memory system according to claim 10, wherein upon reception of the data mask signal, the memory system does not perform a write operation for the memory.

16. The memory system according to claim 10, wherein the data corresponding to the first signal of the first state is not written back to the memory.

17. The memory system according to claim 10, wherein upon reception of the first signal of the first state, the controller discards the data corresponding to the first signal of the first state.

18. The memory system according to claim 11, wherein upon reception of the first signal of the second state, the controller writes the data corresponding to the first signal of the second state back to the memory.

19. The memory system according to claim 10, wherein the memory comprises a resistance change element capable of holding data.

20. The memory system according to claim 10, wherein the memory is one of a magnetoresistive random access memory (MRAM), a ferroelectric random access memory (FeRAM), a phase change random access memory (PCRAM) and a resistive random access memory (ReRAM).

\* \* \* \* \*